United States Patent
Takahashi

(10) Patent No.: US 8,628,174 B2
(45) Date of Patent: Jan. 14, 2014

(54) PIEZOELECTRIC ELEMENT, METHOD OF MANUFACTURING THE SAME, AND INK JET HEAD

(75) Inventor: Shuji Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 284 days.

(21) Appl. No.: 12/717,816

(22) Filed: Mar. 4, 2010

(65) Prior Publication Data

US 2010/0231657 A1   Sep. 16, 2010

(30) Foreign Application Priority Data

Mar. 13, 2009   (JP) ................................ 2009-061782

(51) Int. Cl.
| | |
|---|---|
| B41J 2/045 | (2006.01) |
| H01L 41/00 | (2013.01) |
| H02N 2/00 | (2006.01) |

(52) U.S. Cl.
USPC ............................................ 347/68; 310/311

(58) Field of Classification Search
None
See application file for complete search history.

(56) References Cited

U.S. PATENT DOCUMENTS 7,841,705 B2 * 11/2010 Takahashi ........................ 347/68

FOREIGN PATENT DOCUMENTS

| JP | 10034922 | | 2/1998 |
|---|---|---|---|
| JP | 10226071 | A | 8/1998 |
| JP | 11078002 | A | 3/1999 |
| JP | 2000-085124 | A | 3/2000 |
| JP | 2000085124 | A * | 3/2000 |
| JP | 2005-119199 | | 5/2005 |
| JP | 2008-235569 | A | 10/2008 |
| JP | 2009-252757 | | 10/2009 |
| WO | 2004/015370 | | 2/2004 |

OTHER PUBLICATIONS

Office Action/Notice of Reasons for Rejection in JP Application No. 2009-061782, dated Apr. 11, 2013, 6 pages (with English translation).

Decision of Refusal, mailed Jul. 9, 2013 in Japanese Application No. 2009-061782, 2 pages.

* cited by examiner

Primary Examiner — Matthew Luu
Assistant Examiner — Erica Lin
(74) Attorney, Agent, or Firm — Fish & Richardson P.C.

(57) ABSTRACT

A piezoelectric element 10 includes a supporting body 12, a lower electrode 16 that is formed over the supporting body, a piezoelectric layer 20 that is formed over the lower electrode, and an upper electrode 24 that is formed over the piezoelectric layer so as to oppose the lower electrode via the piezoelectric layer. A step portion 20A is formed at a peripheral portion of the piezoelectric layer at a side of the lower electrode such that a surface of the piezoelectric layer at the side of the lower electrode is larger than a surface of the piezoelectric layer at a side of the upper electrode.

9 Claims, 7 Drawing Sheets

STRESS IS CONCENTRATED

PIEZOELECTRIC ELEMENT, METHOD OF MANUFACTURING THE SAME, AND INK JET HEAD

CROSS REFERENCE TO RELATED APPLICATION

This application claims priority under 35 USC 119 from Japanese Patent Application No. 2009-061782 filed on Mar. 13, 2009, the disclosure of which is incorporated herein by reference.

BACKGROUND OF THE INVENTION

1. Field of the Invention

The present invention relates to a piezoelectric element, a method of manufacturing the same, and an ink jet head.

2. Description of the Related Art

An ink jet recording apparatus discharges liquid droplets (ink) from fine nozzles and form an image composed of a group of dots formed by the liquid droplets on a recording medium such as a sheet. The performance of this type of ink jet recording apparatus greatly depends on the performance of an ink jet head.

FIG. 6 shows an example of the structure of a general ink jet head. An ink jet head 100 includes a substrate 130 in which a pressure chamber 120 that stores a liquid (ink) and applies pressure, a flow path 122, a discharge port 124, and a supply hole 126 through which a liquid is supplied from a tank (not shown) filled up with a discharge liquid to the pressure chamber 120 are formed. A piezoelectric element that applies pressure to the liquid stored in the pressure chamber 120 is provided on the substrate 130 with an insulating film 104 interposed therebetween. The piezoelectric element includes a lower electrode 106, a piezoelectric layer 108, an upper electrode 110, a protective film (barrier film) 112, and a wiring line 114 connected to the upper electrode 110.

For example, in an ink jet head or a FeRAM using the piezoelectric element, the piezoelectric layer is one of the important elements.

For example, Japanese Patent Application Laid-Open (JP-A) No. 10-34922 discloses a method in which, when a piezoelectric ink jet head is manufactured, a groove is formed in a portion of a piezoelectric film corresponding to a gap between pressure chambers by, for example, dicing, thereby forming plural piezoelectric layers forming piezoelectric elements.

Japanese Patent Application Laid-Open (JP-A) No. 10-226071 discloses an ink jet head in which an insulating layer is formed so as to cover the upper surface of an upper electrode and the side surface of a piezoelectric layer in order to prevent stress concentration and the deterioration of the piezoelectric layer due to a leakage current between the upper and lower electrodes or moisture absorption.

Japanese Patent Application Laid-Open (JP-A) Nos. 11-78002, 2000-85124, and 2008-235569 disclose ink jet heads in which a piezoelectric layer having a trapezoidal shape in a cross-sectional view in a thickness direction is formed to prevent damage due to stress concentration, improve mechanical strength, and prevent a leakage current. For example, Japanese Patent Application Laid-Open (JP-A) No. 2008-235569 discloses a structure in which the side surface of a ferroelectric layer is inclined at an angle of 45° or more in order to ensure sufficient displacement and the side surface is inclined at an angle of 75° or less in order to adhere a large number of plasma particles to the side surface of the ferroelectric layer crystal to restore a crystal state.

SUMMARY OF THE INVENTION

The present invention has been made in view of the above circumstances and provides the following piezoelectric element.

According to a first aspect of the invention, a piezoelectric element is provided, which includes a supporting body; a lower electrode that is formed over the supporting body; a piezoelectric layer that is formed over the lower electrode; and an upper electrode that is formed over the piezoelectric layer so as to oppose the lower electrode via the piezoelectric layer, a step portion being formed at a peripheral portion of the piezoelectric layer at a side of the lower electrode such that a surface of the piezoelectric layer at the side of the lower electrode is larger than a surface of the piezoelectric layer at a side of the upper electrode.

According to a second aspect of the invention, a method of manufacturing a piezoelectric element is provided, which includes: forming a lower electrode over a supporting body; forming a piezoelectric film over the lower electrode; forming a mask over a portion of the piezoelectric film; subjecting to dry etching a portion of the piezoelectric film exposed from the mask thereby reducing the thickness of the exposed portion, whereby a portion of the piezoelectric film covered with the mask becomes a convex portion; forming an etching protective film over at least a side surface of the convex portion; and removing, by etching, a portion of the reduced-thickness portion of the piezoelectric film that is exposed from the etching protective film, thereby forming a step portion at a peripheral portion of the convex portion at a side of the lower electrode.

DETAILED DESCRIPTION OF THE INVENTION

Hereinafter, exemplary embodiments of the invention will be described with reference to the accompanying drawings.

Figure 7:
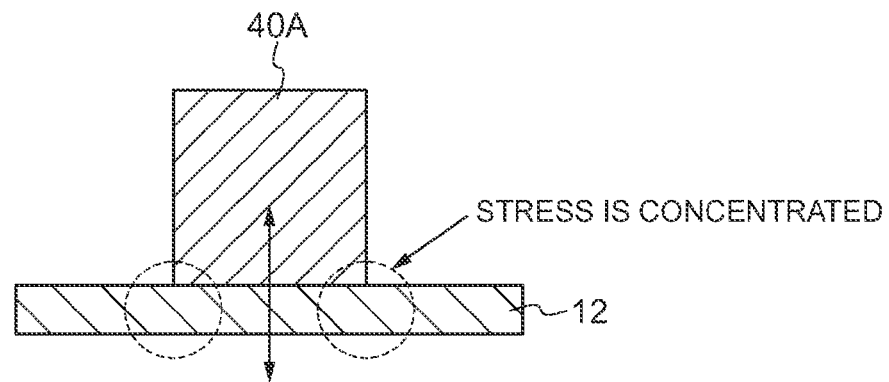
FIG. 7 is a diagram schematically illustrating a piezoelectric layer having a rectangular shape in a cross-sectional view.
Figure 8:
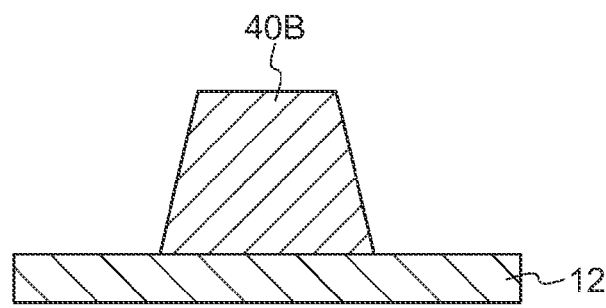
FIG. 8 is a diagram schematically illustrating a piezoelectric layer having a trapezoidal shape in a cross-sectional view.

For example, as shown in FIG. 7, when a vertical piezoelectric layer 40A having a rectangular shape in a cross-sectional view in a thickness direction is formed on a substrate 12, stress is likely to be concentrated on the edge of the piezoelectric layer 40A. As shown in FIG. 8, when a piezoelectric layer 40B having a trapezoidal shape in a cross-sectional view in the thickness direction in which a side surface is inclined is formed, the area of the lower surface of the piezoelectric layer is increased and stress concentration is reduced.

However, when the piezoelectric layer 40B having the above-mentioned shape is formed, the width of a piezoelectric element is increased. In this case, it is difficult to increase the density of nozzles, which inhibits any increase in resolution. When a piezoelectric film is processed by dry etching and the side surface of the piezoelectric layer 40B is inclined, the area of the piezoelectric layer exposed to plasma is greater than that when the side surface is vertical, and the piezoelectric layer is more likely to be damaged by the plasma. Therefore, even if, for example, a barrier film (insulating layer) is formed on the piezoelectric layer 40B after the piezoelectric layer 40B having the above-mentioned shape is formed by dry etching, the piezoelectric layer 40B is likely to remain damaged.

Figure 9:
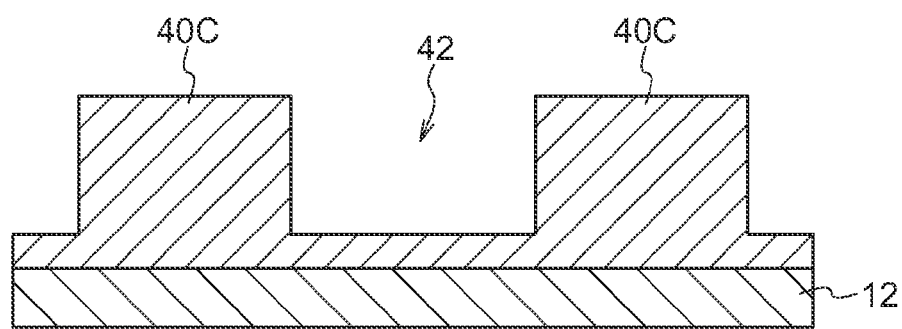
FIG. 9 is a diagram schematically illustrating a piezoelectric layer having a groove formed in a piezoelectric film.

Meanwhile, as shown in FIG. 9, according to a method that a groove 42 is formed in a piezoelectric film with a uniform thickness to form piezoelectric layers 40C corresponding to each pressure chamber, stress concentration is suppressed. However, in this structure, since the piezoelectric layers 40C are connected to each other, there is interference between adjacent piezoelectric elements, which has an adverse effect on an ink discharge performance.

The inventors have conducted extensive studies and examinations in order to solve the above-mentioned problems. The studies and examinations proved that the following method of forming a piezoelectric layer could solve the problems.

That is, when a piezoelectric film is processed by dry etching, a mask having a substantially vertical side is formed on the piezoelectric film, a portion of the piezoelectric film exposed from the mask is etched to a certain depth, and the etching is terminated when the portion of the piezoelectric film covered with the mask has attained a convex shape. Then, an etching protective film is formed on the side surface of the formed convex portion, and an etching process is performed again to process the piezoelectric layer substantially vertically.

Figure 10:
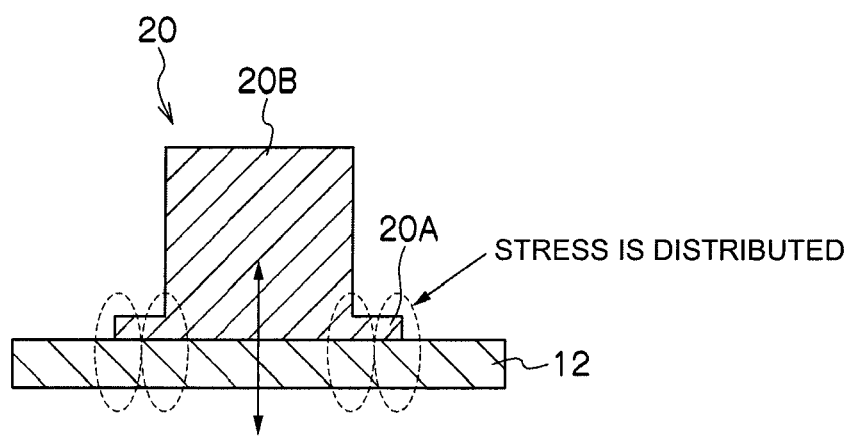
FIG. 10 is a diagram schematically illustrating an example of the piezoelectric layer forming the piezoelectric element according to the embodiment of the invention.

According to the above-mentioned method, as shown in FIG. 10, a piezoelectric layer 20 having a step portion 20A at the boundary between the piezoelectric layer and a lower electrode (not shown) is formed, and the distance (creepage distance) between an upper electrode (not shown) and the lower electrode is increased. Therefore, it is possible to more effectively reduce a leakage current, as compared to the structure in which the piezoelectric layer 40B having an inclined side surface is formed. Since the step portion 20A is formed at the lower-electrode side of the piezoelectric layer 20, the coverage of a wiring line connected to the upper electrode is improved and stress applied to the wiring line or an insulating film (barrier film) is reduced. In this way, stress applied to the piezoelectric layer 20 during driving is distributed and stress concentration is reduced. Therefore, the durability and reliability of a head are improved. In addition, since the inclination of the side surface of the piezoelectric layer 20 can be reduced, it is possible to increase the density of the piezoelectric layer and prevent plasma damage during dry etching. Therefore, it is possible to further improve the reliability of the head.

Figure 1:
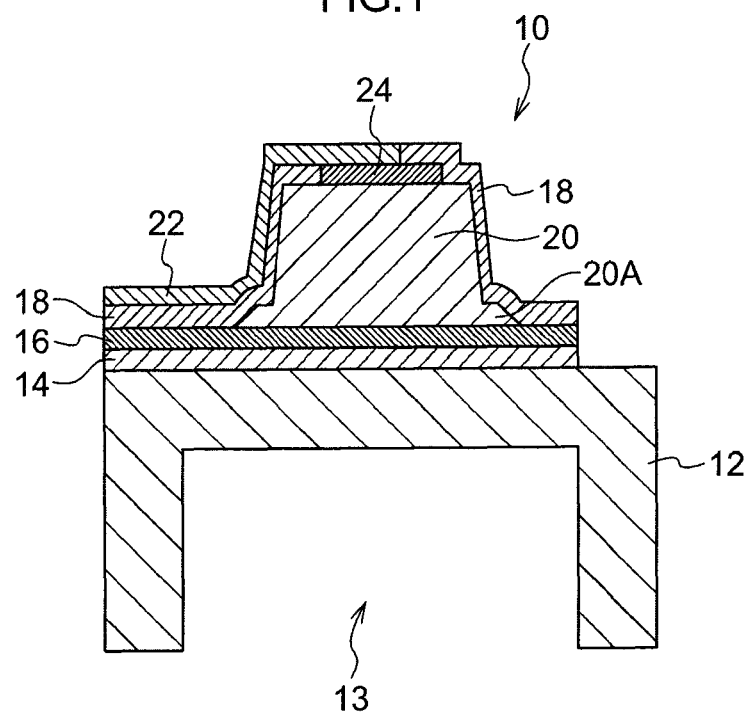
FIG. 1 is a diagram schematically illustrating an example of the structure of a piezoelectric element according to an embodiment of the invention.
Figure 2:
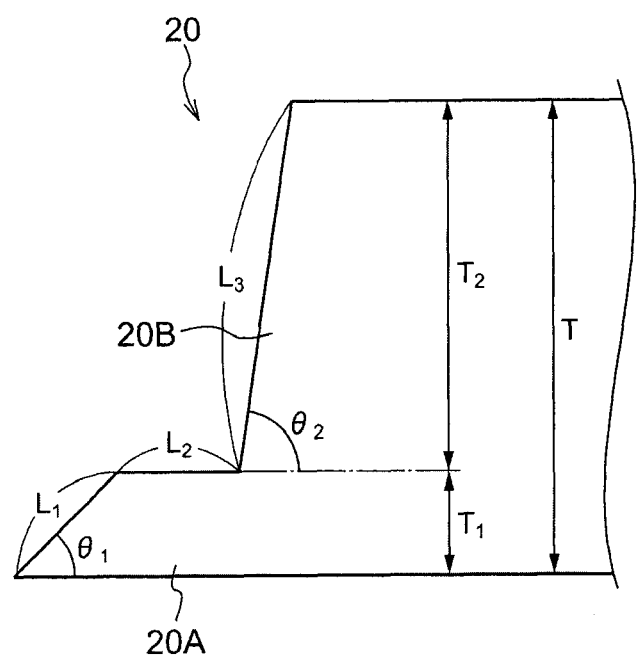
FIG. 2 is an enlarged view schematically illustrating a portion of a piezoelectric layer according to the embodiment of the invention.

FIG. 1 is a diagram schematically illustrating an example of the structure of an ink jet head including a piezoelectric element according to an embodiment of the invention. FIG. 2 is an enlarged view illustrating a portion of the piezoelectric layer 20.

A piezoelectric element 10 according to this embodiment includes a lower electrode 16 formed over a supporting body (a substrate 12 and an insulating film 14), the piezoelectric layer 20 formed over the lower electrode 16, and an upper electrode 24 formed over the piezoelectric layer 20 so as to oppose the lower electrode 16 via the piezoelectric layer 20. A step portion 20A is formed at a peripheral portion of the piezoelectric layer 20 at a side of the lower electrode 16, and the surface of the piezoelectric layer 20 at the side of the lower electrode 16 is larger than that at a side of the upper electrode 24. A protective film (barrier film) 18 is formed over a portion of the piezoelectric layer 20 and the upper electrode 24, and another portion of the upper electrode 24 is exposed from the protective film 18 and is electrically connected to a wiring line 22. A pressure chamber 13 is formed in the substrate 12.

Next, a method of manufacturing the ink jet head including the piezoelectric element 10 according to this embodiment and the piezoelectric element 10 will be described in detail. The method of manufacturing the piezoelectric element according to this embodiment of the invention is not limited to the following method, and a material forming the piezoelectric element, the thickness of components of the piezoelectric element, and a film forming method are also not limited to the following examples. However, the method, material, thickness, and film forming method may be appropriately selected depending on the purpose of the piezoelectric element.

<First Method>

Figure 3:
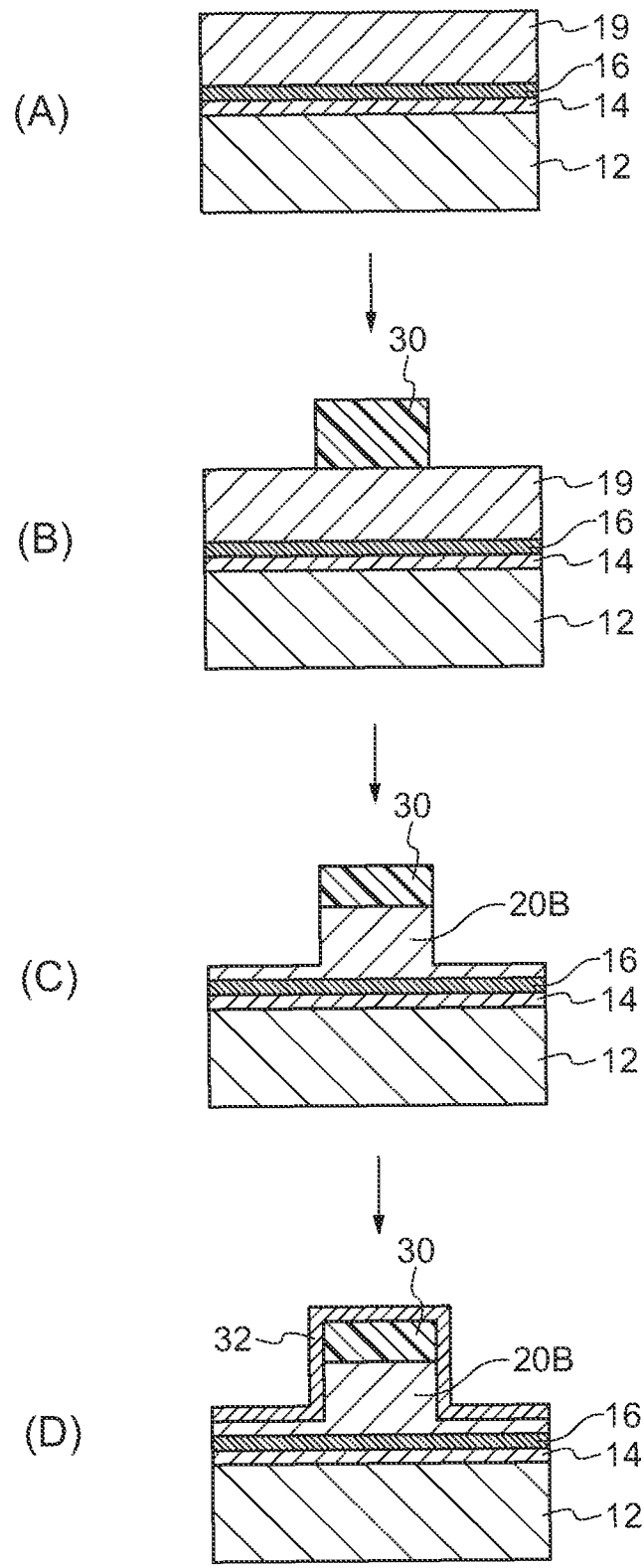
FIG. 3 is a diagram illustrating a first half process of a first method of manufacturing the piezoelectric element according to the embodiment of the invention.
Figure 4:
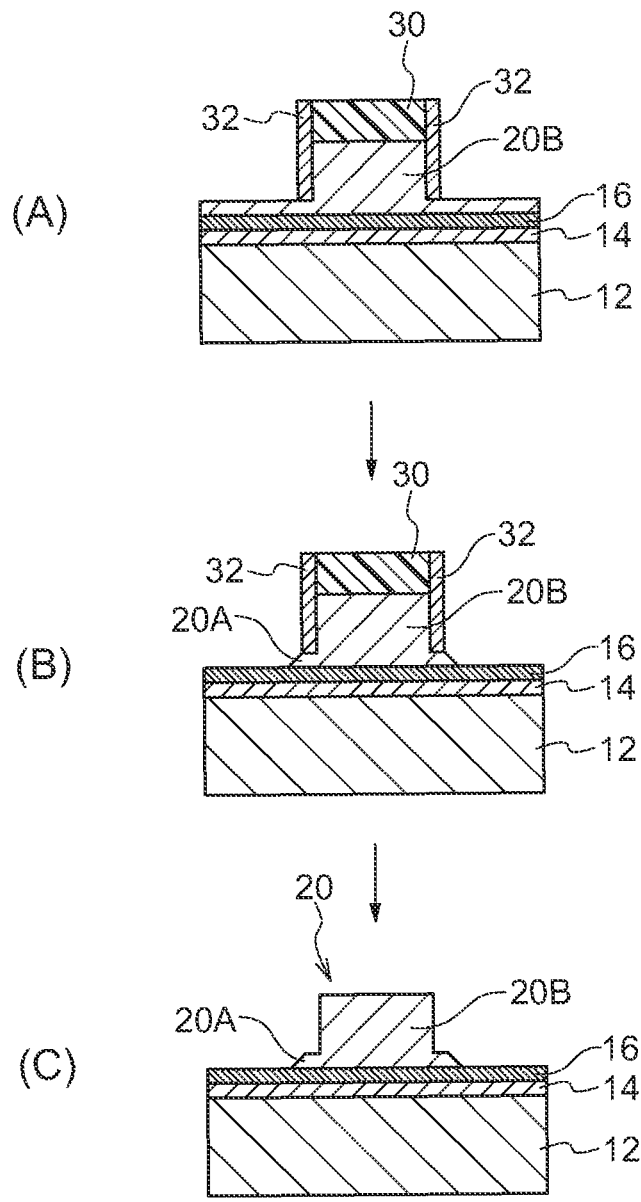
FIG. 4 is a diagram illustrating a second half process of the first method of manufacturing the piezoelectric element according to the embodiment of the invention.

FIGS. 3 and 4 show an example (first method) of the method of manufacturing the piezoelectric element according to this embodiment of the invention.

(1) Formation of Lower Electrode

The lower electrode 16 is formed on the supporting body.

First, the insulating film 14, for example, an oxide film ($SiO_2$) is formed on the surface of the silicon substrate 12, which is a supporting body, by a sputtering method, a CVD method, or a thermal oxidation method. The thickness of the oxide film 14 is, for example, about 500 nm.

Next, a layer (not shown) made, for example, of Ti is formed on and securely adhered to the insulating film 14. The thickness of the adhered layer is in the range of, for example, about 10 nm to about 20 nm.

After the adhered layer is formed, the lower electrode 16 is formed. The lower electrode 16 made of a noble metal material, such as Pt, Ir, Ru, or oxides thereof, may be formed by, for example, a sputtering method or a CVD method. The thickness of the lower electrode 16 is, for example, about 200 nm.

(2) Formation of Piezoelectric Film

Next, a piezoelectric film 19 is formed on the lower electrode 16 (FIG. 3(A)). The piezoelectric film 19 made of, for example, lead zirconate titanate (PZT) may be formed by a sputtering method or a CVD method. The thickness of the piezoelectric film 19 is, for example, about 3 μm.

(3) Formation of Mask

Next, a mask 30 for patterning the piezoelectric film 19 is formed (FIG. 3(B)).

The mask 30 may be an oxide film ($SiO_2$) or a hard mask made of, for example, chrome, or it may be made of a photosensitive resin, such as a photoresist (a negative resist or a positive resist). It is preferable that the mask 30 be made of a photoresist in order to reduce the number of processes. As the photoresist, for example, any of the following may be used: OFPR series and TSMR series manufactured by Tokyo Ohka Kogyo Co., Ltd.; and 1500 series and 10×T series manufactured by AZ Electronic Materials.

For example, when a resist mask having a thickness of 10 μm is made of 10×T manufactured by AZ Electronic Materials, a resist is applied onto the substrate by a spin coater at 1000 rpm for 30 seconds, thereby forming a resist film.

A resist is coated on the piezoelectric film 19 by, for example, a spin coat method or a spray coat method, and the resist film is subjected to a soft baking process. The resist is formed to have a thickness of, for instance, about 0.1 μm to about 20 μm after the soft baking process such that it can functions as a mask during dry etching and be easily removed after dry etching. The soft baking process is performed using a heating device, such as a hot plate or an oven, at the optimal temperature depending on various kinds of resist materials (for example, at a temperature of 60° C. to 150° C. for 1 to 15 minutes). For example, the soft baking process is performed using the hot plate at a temperature of 100° C. for 90 seconds.

Next, the resist is patterned into a mask shape by photolithography (exposure and development). The exposure is performed through a photomask such that the resist after the development becomes a mask 30 and the piezoelectric film 19 after the dry etching is patterned into a desired shape.

The exposure may be performed using an aligner or a stepper, and the optimal amount of exposure may be selected depending on the kind of resist materials. For example, the exposure is performed with a contact aligner. For example, an apparatus on the market, such as MA-6 manufactured by SUSS MicroTec, Inc., may be used as the contact aligner. The exposure may be performed such that the amount of exposure is, for example, 800 mJ/cm$^2$.

After the exposure, a baking (PEB: post exposure bake) process may be performed depending on the kind of resist used. After the exposure and before development, PEB can be performed to compensate insufficient exposure or reduce the deformation of the pattern shape due to a standing wave during exposure.

Next, development is performed. The substrate 12 is immersed in a developer and is then rinsed with pure water. Then, the substrate is dried. For example, a commercially available developer, such as AZ300MIF manufactured by AZ Electronic Materials, may be used. The substrate is immersed in the developer for about 10 minutes and is then rinsed with pure water for 180 seconds twice. Then, water adhering to the substrate 12 is removed by, for example, a spin dryer.

A post-baking process is performed after development, if necessary. When the post-baking process is performed, the substrate may be heated by a heating device, such as a hot plate or an oven, at a temperature of about 100° C. to 200° C. for 1 to 60 minutes. In this case, the shape of the resist mask 30 in a cross-sectional view varies depending on the heating temperature. Therefore, the post-baking process is performed at an appropriate temperature. For example, the substrate may be heated by a hot plate at an arbitrary temperature for about 120 seconds.

(4) Patterning of Piezoelectric Film

Next, the thickness of a portion of the piezoelectric film 19 exposed from the mask 30 is reduced by dry etching such that a portion of the piezoelectric film covered with the mask 30 becomes a convex portion (main body) 20B (FIG. 3(C)).

As a dry etching apparatus, for example, an inductive coupling plasma (ICP) dry etching apparatus may be used. The dry etching apparatus used in this embodiment of the invention is not particularly limited. For example, the piezoelectric film 19 may be processed by a method using a plasma source such as a helicon wave plasma (HWP), an electron cyclotron resonance plasma (ECP), or a microwave-excited surface wave plasma (SWP).

When PZT of the piezoelectric film 19 is subjected to dry etching, any of the following gases is introduced as a process gas into a chamber of the dry etching apparatus: $Cl_2$ (chlorine); $BCl_3$ (boron trichloride); HBr (hydrogen bromide); $SF_6$ (sulfur hexafluoride); $CF_4$ (carbon tetrafluoride); $CHF_3$ (trifluoromethane); $C_2F_6$ (ethane hexafluoride); $C_3F_8$ (propane octafluoride); $C_4F_6$ (butadiene hexafluoride); $C_4F_8$ (cyclobutane octafluoride); $C_5F_8$ (octafluorocyclopentene); mixed gases thereof; an inert gas such as argon; and a mixed gas having oxygen or nitrogen added thereto, if necessary.

A high-frequency wave is applied to a plasma generating antenna to generate plasma and a high-frequency wave for bias is applied to a stage having a process substrate mounted thereon to perform etching. For example, 13.56 MHz is used as a high-frequency generator for the antenna, and 500 kHz, which is a low frequency, is used for the bias. An RF of 13.56 to 60 MHz may be used for the antenna and a low frequency power of 100 kHz to 2 MHz may be used.

The representative etching conditions are as follows.

A mixed gas of 10% to 60% (vol %) of chlorine and 40% to 90% (vol %) of $C_4F_8$ is used as the process gas. For example, the flow rate of chlorine may be 20 sccm and the flow rate of $C_4F_8$ may be 80 sccm.

The pressure of the process gas may be in the range of from 0.1 to 5 Pa, for example, 1.0 Pa.

The RF power of the antenna is in the range of from 350 to 1000 W, for example, 500 W. The bias power of the substrate is in the range of from 50 to 500 W, for example, 200 W.

When a resist is used for the mask, the temperature of the stage may be in the range of from −20 to 150° C., for example, 5° C.

A portion of the piezoelectric film 19 exposed from the mask 30 is etched such that the thickness thereof is reduced, thereby forming concave and convex portions. A portion of the piezoelectric film 19 covered with the mask 30 attains a convex shape. In this case, etching is performed such that the exposed portion of the piezoelectric film 19 is not completely removed, but partially remains. Since a remaining part (thickness) of the exposed portion of the piezoelectric film 19 corresponds to the height (thickness) of the step portion 20A, it is possible to control the height of the step portion 20A by controlling the etching time. The remaining part of the piezoelectric film 19, that is, the height of the step portion 20A may be in the range of, for example, from 100 nm to 1 μm.

(5) Formation of Etching Protective Film

The piezoelectric film 19 is subjected to dry etching to form the convex portion 20B, and then an etching protective film 32 is formed on at least the side surface of the convex portion 20B of the piezoelectric film.

For example, after dry etching stops, the etching protective film 32 is formed on the entire surface of the substrate (FIG. 3(D)). The etching protective film 32 may be an oxide film such as an $SiO_2$ film, or may be formed by, for example, a sputtering method, a CVD method, or an atmospheric CVD method. However, when the oxide film is used, it is difficult to remove the oxide film in the subsequent process. In addition, when the protective film 32 is removed, the piezoelectric layer 20 is likely to be damaged. From the above-mentioned point of view, it is desirable that the protective film 32 be made of a fluorine-containing (CF) polymer.

The protective film 32 made of a CF polymer may be formed by using, for example, an apparatus used for performing dry etching of the piezoelectric film 19 and a plasma process may be performed using gas including C and F such as $CF_4$ (carbon tetrafluoride), $CHF_3$ (trifluoromethane), $C_2F_6$ (ethane hexafluoride), $C_3F_8$ (propane octafluoride), $C_4F_6$ (butadiene hexafluoride), $C_4F_8$ (cyclobutane octafluoride), or $C_5F_8$ (octafluorocyclopentene).

Specifically, the flow rate of $C_4F_8$ is 25 sccm, the pressure is controlled at 3 Pa, and the output of a plasma generating RF power supply is 1000 W. In this case, a bias may be applied to the substrate 12, if necessary. It is possible to control the thickness of the protective film 32 by adjusting the process time under the above-mentioned conditions. In this case, it is possible to control the length of a protruding part (horizontal part) of the step portion 20A by adjusting the thickness of the protective film 32, specifically, the thickness of the protective film 32 formed on the side surface of the convex portion 20B of the piezoelectric layer. As such, since it is possible to control the length of the step portion 20A of the piezoelectric layer 20 by adjusting the thickness of the protective film 32, a high degree of control is possible. Specifically, the protective film 32 made of a CF polymer is formed to have a thickness of about 1 μm on the side surface of the convex portion 20B, with a processing time of five minutes.

(6) Removal of Portion of Etching Protective Film (Descum Process)

A descum process is performed such that, of the protective film 32 formed on the entire surface of the substrate, a portion of the protective film that is formed on the side surface of the convex portion 20B of the piezoelectric layer remains and portions of the protective film that are formed on the upper surface of the convex portion 20B and regions (planar regions) other than the convex portion 20B are removed (FIG. 4(A)).

The descum process may be performed by the dry etching apparatus used in "(4) Patterning of piezoelectric film" and "(5) Formation of protective film". As such, since one dry etching apparatus is used to perform plural processes, it is possible to improve efficiency and reduce manufacturing costs. For example, the descum process is performed under the conditions of an oxygen flow rate of 50 sccm, a pressure of 0.5 Pa, a plasma generating RF output of 1000 W, a substrate bias output of 300 W, and a process time of about 1 minute to remove the protective film 32 formed on portions other than the side surface of the convex portion 20B. It is possible to selectively remove the protective film formed on the planar portion with little etching of the protective film 32 on the side surface of the convex portion 20B owing to the directivity of ions by performing the descum process at a vacuum of 1 Pa or less.

(7) Formation of Step Portion

A portion of the reduced-thickness portion of the piezoelectric film 19 which is exposed from the etching protective film 32 is removed by etching to form the step portion 20A at a peripheral portion of the convex portion 20B at the side of the lower electrode 16 (FIG. 4(B)).

For example, a portion of the piezoelectric film exposed from the resist mask 30 and the protective film 32 is completely removed by the same dry etching method as that in "(4) Patterning of piezoelectric film". Since the resist mask 30 is formed on the upper surface of the convex portion 20B of the piezoelectric film and the protective film 32 is formed on the side surface of the convex portion 20B, the convex portion 20B is not etched. Of the reduced-thickness portion of the piezoelectric film that is not part of the convex portion 20B, a portion of the piezoelectric film that is disposed at a peripheral part of the convex portion 20B at the side of the lower electrode 16 and that corresponds to the thickness of the protective film 32 is protected so as not to be etched. In this way, the step portion (flange portion) 20A of the piezoelectric film is formed at a peripheral portion of a part of the convex portion 20B at the side of the lower electrode 16. Even when a material forming the lower electrode 16 below the piezoelectric film 19 is scattered by over etching, it is possible to prevent the material from being directly adhered to the side wall of the piezoelectric layer 20 since the protective film 32 is formed on the side surface of the piezoelectric convex portion 20B. Therefore, it is possible to reliably prevent a leakage current.

Next, for example, the thickness and angle of the main body 20B and the step portion 20A of the piezoelectric layer 20 will be described in detail.

As shown in FIG. 2, the overall thickness of the piezoelectric layer 20 is T, the thickness of the step portion 20A of the piezoelectric layer 20 (the distance from the lower electrode-side surface to the upper surface of the step portion 20A) is $T_1$, and the thickness from the upper surface of the step portion 20A to the upper surface of the piezoelectric layer 20 is $T_2$. In addition, the angle formed between the lower electrode-side surface of the piezoelectric layer 20 and the side surface of the step portion 20A (appropriately referred to as "the inclination angle of the step portion") is $\theta_1$ and the angle formed between the lower electrode-side surface of the piezoelectric layer 20 and the side surface of the main body 20B (a portion in which the step portion 20A is not formed) (appropriately referred to as "the inclination angle of the main body") is $\theta_2$.

If the thickness T of the piezoelectric layer 20 is 1 μm or more, sufficient displacement is obtained when the piezoelectric layer is used in the ink jet head. If the thickness T is 5 μm or less, the occurrence of cracks in the piezoelectric layer 20 is prevented, and it is possible to form the layer in a relatively short time using a gas phase method, such as a sputtering method or a CVD method. Therefore, it is possible to prevent an increase in manufacturing costs. For these reasons, it is preferable that the thickness T of the piezoelectric layer 20 be in the range of from 1 μm to 5 μm, for example, about 3 μm.

It is preferable that the thickness $T_1$ of the step portion 20A of the piezoelectric layer 20 be no more than one-third of the thickness T of the piezoelectric layer 20 in order to obtain sufficient displacement. For example, when the thickness T of the piezoelectric layer 20 is 3 μm, it is preferable that the thickness $T_1$ of the step portion 20A be 1 μm or less and the thickness $T_2$ of the portion 20B (the porton above the step portion 20A) other than the step portion 20A be 2 μm or more. However, if the thickness $T_1$ of the step portion 20A is excessively small, a crack is likely to occur in the step portion 20A when the piezoelectric layer 20 is displaced. Therefore, it is preferable that the thickness $T_1$ of the step portion 20A be equal to or more than one-tenth of the overall thickness of the piezoelectric layer 20.

In the cross section of the thickness direction of the piezoelectric layer 20 shown in FIG. 2, when the length of a side portion of the step portion 20A is $L_1$, the length of an upper portion (appropriately referred to as "the length of the upper surface") of the step portion 20A is $L_2$, the length of the portion (main body) 20B above the step portion 20A of the piezoelectric layer 20 is $L_3$, and the creepage distance of the piezoelectric layer 20 is L, $L=L_1+L_2+L_3$ is satisfied. As the length L is increased, the creepage distance is increased. In order to increase the creepage distance, it is preferable to increase the length $L_2$ of the upper surface of the step portion 20A of the piezoelectric layer 20. However, in order to form the protective film 32, serving as an etching mask, on the side surface of the main body 20B of the piezoelectric layer, it is preferable that the length $L_2$ of the upper surface of the step portion 20A be in the range of from 100 nm to 3 μm. When the length $L_2$ of the upper surface of the step portion 20A is 100 nm or more, the creepage distance can be increased by the step portion 20A. In addition, it is possible to form the protective film 32 having a desired thickness corresponding to the etching mask when the step portion 20A is formed. When the length $L_2$ of the upper surface of the step portion 20A is 3 µm or less, it is possible to easily form the etching protective film 32 in a short time and perform the descum process in a relatively short time. Therefore, it is possible to prevent a reduction in productivity.

It is preferable that the inclination angle $\theta_2$ of the main body 20B of the piezoelectric layer be substantially vertical in order to arrange plural piezoelectric elements, such as ink jet heads, at high density. In addition, from the viewpoint of manufacturing, when the piezoelectric film 19 is etched twice to form the step portion 20A, the piezoelectric film is etched to a depth corresponding to the thickness $T_2$ of the main body 20B of the piezoelectric layer by a first etching process. Then, a process of forming the etching protective film 32, the descum process, and a second etching process are performed to form the step portion 20A.

The shape of the main body 20B of the piezoelectric layer is substantially determined by the first etching process, and it is difficult to form the main body 20B with dry etching such that the inclination angle $\theta_2$ thereof is more than 90°. Even if the main body 20B is formed such that the inclination angle $\theta_2$ thereof is more than 90°, reproducibility deteriorates and coverage is insufficient when the protective film is formed. Therefore, it is preferable that the inclination angle $\theta_2$ be equal to or less than 90°.

Meanwhile, when the second etching process is performed after the protective film is formed, if the inclination angle $\theta_2$ of the main body 20B of the piezoelectric layer is less than 75°, ions are likely to attack the protective film 32 during etching such that the protective film itself is etched. As a result, the shape of the step portion 20A may be adversely affected.

For this reason, it is preferable that the inclination angle $\theta_2$ of the convex portion (the main body of the piezoelectric layer) 20B be 75° or more and 90° or less.

When the inclination angle $\theta_1$ of the step portion 20A is 45° or less, it is possible to prevent the distance between adjacent piezoelectric elements from being excessively short and thus increase the density of the piezoelectric elements. In addition, when the inclination angle $\theta_1$ of the step portion 20A is 75° or less, it is possible to effectively prevent the coverage of the insulating film 18 or the wiring line 22 from being reduced in the subsequent process. Therefore, it is preferable that the inclination angle $\theta_1$ of the step portion 20A be in the range of from 45° to 75°.

For the above-mentioned reasons, it is preferable that the inclination angle $\theta_1$ of the step portion 20A of the piezoelectric layer be smaller than the inclination angle $\theta_2$ of the main body 20B.

In order to form the step portion 20A such that the side surface (outer peripheral surface) thereof is inclined at a certain angle, the following methods, for example, may be used: a method of actively adding gas for forming the protective film 32 (a method of increasing the flow rate of the gas added); and a method of increasing a bias output applied to the substrate 12 and performing etching while retreating (thinning) the protective film 32.

Representative etching conditions are as follows.

A mixed gas of 10% to 60% of chlorine and 40% to 90% of $C_4F_8$ is used as a process gas. For example, the flow rate of chlorine may be 20 sccm, and the flow rate of $C_4F_8$ may be 80 sccm.

The pressure of the process gas may be in the range of from 0.1 to 5 Pa, for example, 1.0 Pa.

The antenna RF power is set in the range of from 350 to 1000 W, for example, 500 W. The substrate bias power is set in the range of from 50 to 500 W, for example, 250 W.

When the resist mask is used, the temperature of the stage is set in the range of from −20 to 150° C., for example, 5° C.

(8) Removal of Mask and Protective Film

After the step portion is formed in the piezoelectric layer 20 by etching, the resist mask 30 and the etching protective film 32 are removed (FIG. 4(C)).

Examples of method for removing them include a method of performing a wet process with a polymer remover on the market, a method using a dry ice blast, and a removal method by water vapor.

When the polymer remover is used to remove the resist mask 30 and the protective film 32, for example, EKC series manufactured by DuPont Corporation or an AZ remover manufactured by AZ Electronic Materials may be used.

When the dry ice blast is used to remove the mask 30, dry ice particles are blown to the process substrate 12 by compressed air to generate a thermal shock and expansion energy generated when the dry ice particles are sublimed is used to peel off and remove the resist mask 30 and the protective film 32.

When the water vapor is used to remove the mask 30, pure water obtained by mixing pure water or a very small amount of chemicals with high-pressure (0.01 to 1 MPa) water vapor is sprayed to a process substrate to remove the resist mask 30 and the protective film 32.

In these methods, it is possible to simultaneously remove the resist mask 30, the protective film 32, and materials deposited on the mask and film during dry etching.

When the piezoelectric film 19 is processed according to the above-mentioned processes, the piezoelectric layer 20 in which the step portion 20A is formed on a side surface at the side of the lower electrode 16 and the surface at the side of the lower electrode 16 is larger than the surface at the side of the upper electrode (the piezoelectric layer 20 having two-stage tapered portions 20A and 20B) is independently formed for each piezoelectric element on the substrate 12.

(9) Formation of Upper Electrode

After the piezoelectric layer 20 having the step portion 20A is formed, for example, the upper electrode 24 and a silicon oxide film, serving as the insulating film (barrier film) 18, are formed on the piezoelectric layer 20. In addition, an opening for leading the wiring line from the upper electrode 24 is formed in the insulating film 18 by patterning, and patterning of the wiring line 22 from the upper electrode 24 is perfromed.

In this way, it is possible to manufacture the piezoelectric element 10 having the structure shown in FIG. 1.

As described above, the step portion 20A in which the surface thereof at the side of the lower electrode 16 has a larger size is formed on the side surface of the piezoelectric layer 20, and preferably, the side surface of the step portion 20A of the piezoelectric layer 20 is processed at a relatively small tapered angle. Therefore, it is possible to improve the coverage of a lower portion of the piezoelectric layer 20 when the insulating film 18 or the wiring line 22 is formed, and thus reduce stress concentration.

<Second Method>

Figure 5:
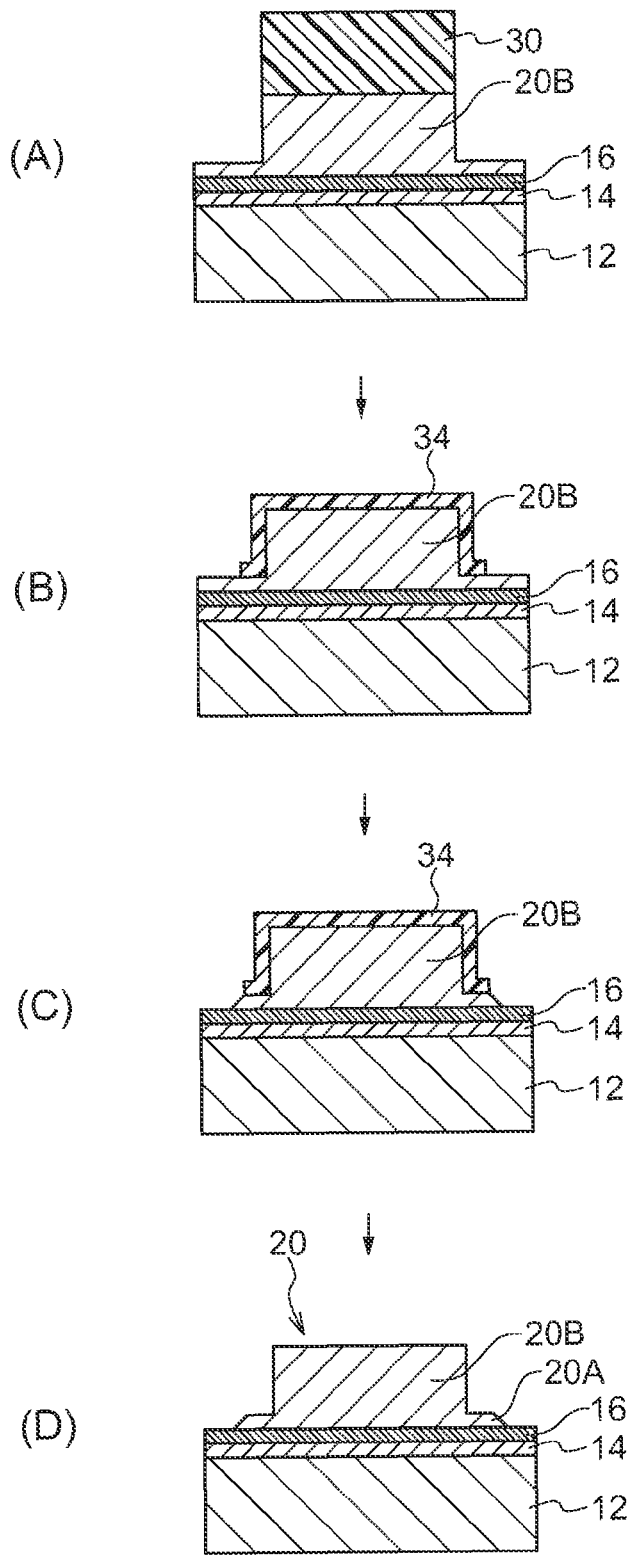
FIG. 5 is a diagram illustrating a second half process of a second method of manufacturing the piezoelectric element according to the embodiment of the invention.
Figure 6:
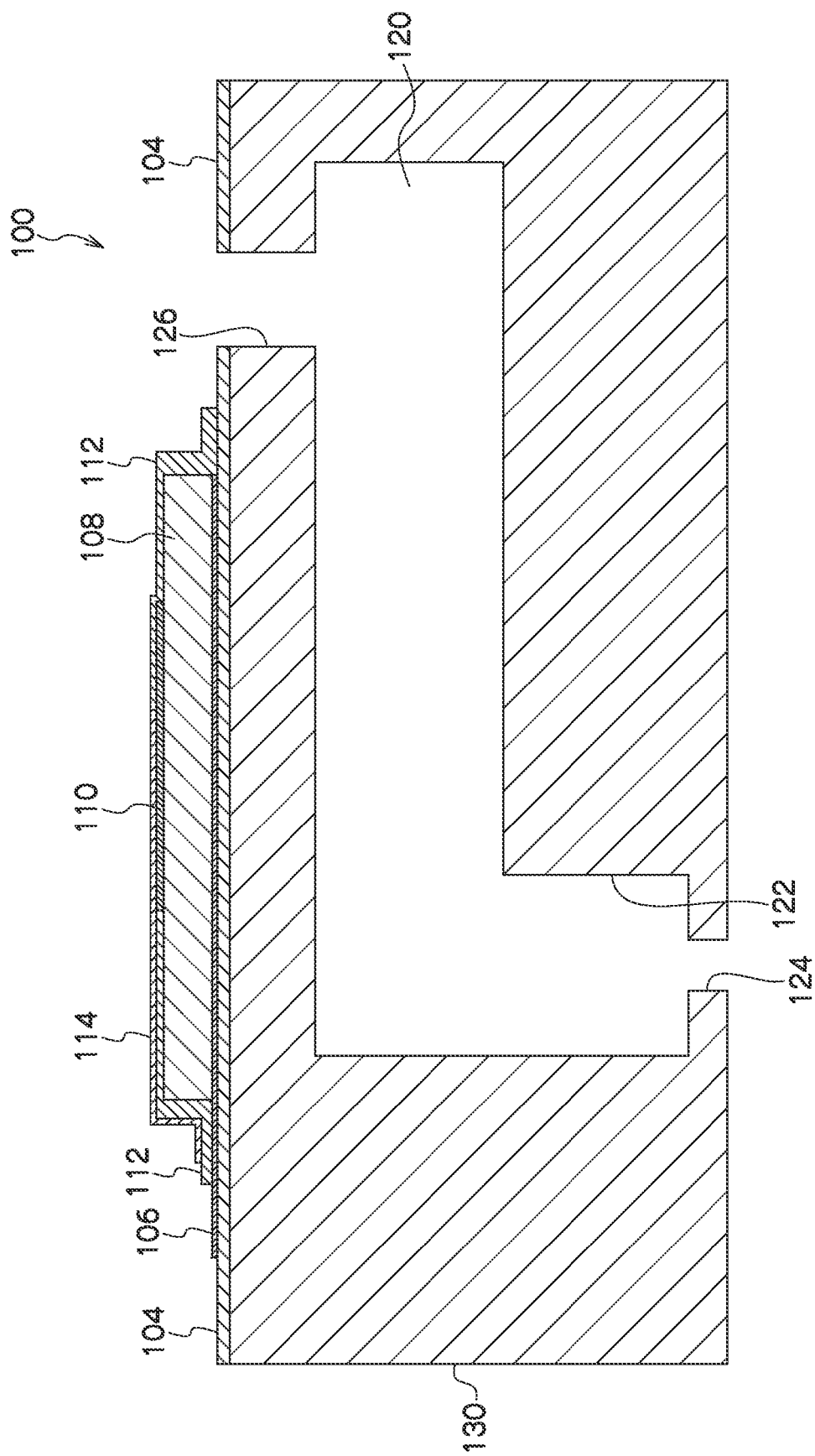
FIG. 6 is a diagram schematically illustrating an example of the structure of an ink jet head.

FIG. 5 shows another example of the method of manufacturing the piezoelectric element according to the invention (second method). In the method, masks are formed twice to form a step portion of a piezoelectric layer.

First, a process of sequentially forming an insulating film, an adhered layer, and a piezoelectric film on a silicon substrate, a process of forming a resist mask on the piezoelectric film, and a process of patterning the piezoelectric film using dry etching are the same as those in the first method and thus detailed description thereof will be omitted.

As shown in FIG. 5(A), patterning of the piezoelectric film is performed through a resist mask 30 such that a portion of the piezoelectric film becomes a convex shape, and the first mask 30 is removed.

Next, a second resist mask 34 (etching protective film) for forming the step portion 20A is formed by a photolithography method so as to cover the convex portion (main body) 20B and the periphery of the convex portion (FIG. 5(B)). After the second mask 34 is formed, dry etching is performed. In this way, a portion of the piezoelectric film that is not covered with the mask 34 is removed (FIG. 5(C)).

After the dry etching, the mask 34 is removed. In this way, the piezoelectric layer 20 having the step portion 20A formed at a peripheral portion of the convex portion 20B at the side of the lower electrode 16 is obtained (FIG. 5(D)).

As such, when the masks 30 and 34 are formed in two stages, the masks 30 and 34 are not necessarily made of only a resist, but they may be, for example, hard masks made of chrome and resist masks. In addition, different mask patterns may be formed, and etching may be performed twice after forming each of the masks to form the step portion 20A.

Preferred exemplary embodiments of the invention are as follows.

An angle $\theta_1$ formed between the lower electrode-side surface of the piezoelectric layer and a side surface of the step portion is less than an angle $\theta_2$ formed between the lower electrode-side surface of the piezoelectric layer and a side surface of a main body of the piezoelectric layer.

The thickness of the step portion is no more than one-third of the thickness of the piezoelectric layer.

The length of an upper surface of the step portion is in the range of from 100 nm to 3 μm.

An ink jet head includes the piezoelectric element.

A method of manufacturing a piezoelectric element includes:

forming a lower electrode over a supporting body;
forming a piezoelectric film over the lower electrode;
forming a mask over a portion of the piezoelectric film;
subjecting to dry etching a portion of the piezoelectric film exposed from the mask thereby reducing the thickness of the exposed portion, whereby a portion of the piezoelectric film covered with the mask becomes a convex portion;
forming an etching protective film over at least a side surface of the convex portion; and
removing, by etching, a portion of the reduced-thickness portion of the piezoelectric film that is exposed from the etching protective film, thereby forming a step portion at a peripheral portion of the convex portion at a side of the lower electrode.

After the portion of the piezoelectric film covered with the mask becomes the convex portion, the etching protective film is formed over the entire surface of the supporting body at a side of the convex portion, without removing the mask, and the etching protective film is removed except for a portion thereof formed over the side surface of the convex portion.

Alternatively, after the portion of the piezoelectric film covered with the mask becomes the convex portion, the mask is removed, and the etching protective film is formed so as to cover the convex portion and the periphery of the convex portion.

The invention has been described above, but the invention is not limited to the above-described embodiments. For example, etching for forming the step portion 20A is not limited to dry etching, but wet etching may be performed.

In the above-described embodiment, after the piezoelectric layer 20 having the step portion 20A is formed, the upper electrode 24 is formed. However, the piezoelectric film and the upper electrode may be simultaneously etched and patterned. That is, before the piezoelectric film 19 is patterned, a metal film to be the upper electrode may be formed on the piezoelectric film 19. Then, a mask may be formed on the metal film and dry etching may be performed to pattern the piezoelectric layer and the upper electrode.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A piezoelectric element comprising:
a supporting body;
a lower electrode that is formed over the supporting body;
a piezoelectric layer that is formed over the lower electrode; and
an upper electrode that is formed over the piezoelectric layer so as to oppose the lower electrode via the piezoelectric layer,
the piezoelectric layer including a first portion at a lower electrode side and a second portion at an upper electrode side, a step portion being formed at a peripheral portion of the first portion of piezoelectric layer such that a surface of the piezoelectric layer at the lower electrode side is larger than a surface of the piezoelectric layer at the upper electrode side, the step portion having a top surface substantially parallel to the lower electrode, a side surface of the step portion at a first substantially constant angle $\theta_1$ to the surface of the piezoelectric layer at the lower electrode side, a side surface of the second portion at a second substantially constant angle $\theta_2$ to the surface of the piezoelectric layer at the lower electrode side, the angle $\theta_1$ being in the range of 45° to 75°, the angle $\theta_2$ being in the range of 75° to 90°, and the angle $\theta_1$ being less than the angle $\theta_2$.

2. The piezoelectric element according to claim 1, wherein a thickness of the step portion is no more than one-third of a thickness of the piezoelectric layer.

3. The piezoelectric element according to claim 1, wherein a length of an upper surface of the step portion is in the range of from 100 nm to 3 μm.

4. An ink jet head comprising the piezoelectric element according to claim 1.

5. A method of manufacturing the piezoelectric element of claim 1, the method comprising:
forming a lower electrode over a supporting body;
forming a piezoelectric film over the lower electrode;
forming a mask over a portion of the piezoelectric film;

subjecting to dry etching a portion of the piezoelectric film exposed from the mask thereby reducing a thickness of the exposed portion to provide a reduced-thickness portion, whereby a portion of the piezoelectric film covered with the mask becomes a convex portion;

forming an etching protective film over at least a side surface of the convex portion; and removing, by etching, a portion of the reduced-thickness portion of the piezoelectric film that is exposed from the etching protective film, thereby forming a step portion at a peripheral portion of the convex portion at a side of the lower electrode.

6. The method of manufacturing a piezoelectric element according to claim 5, wherein after the portion of the piezoelectric film covered with the mask becomes the convex portion, the etching protective film is formed over an entire surface of the supporting body at a side of the convex portion, without removing the mask, and the etching protective film is removed except for a portion thereof formed over the side surface of the convex portion.

7. The method of manufacturing a piezoelectric element according to claim 5, wherein after the portion of the piezoelectric film covered with the mask becomes the convex portion, the mask is removed, and the etching protective film is formed so as to cover the convex portion and the peripheral portion of the convex portion.

8. The piezoelectric element according to claim 1, wherein a thickness of the piezoelectric layer is in the range of from 1 µm to 5 µm.

9. The piezoelectric element according to claim 2, wherein a thickness of the step portion is equal to or more than one-tenth of a thickness of the piezoelectric layer.

* * * * *